United States Patent [19]
Korn et al.

[11] Patent Number: 6,086,127
[45] Date of Patent: *Jul. 11, 2000

[54] METHOD OF MAKING A CARRIER FOR AT LEAST ONE WAFER

[75] Inventors: David Korn; Keith Smith, both of Boise, Id.

[73] Assignee: Micron Technology, Inc., Boise, Id.

[ * ] Notice: This patent is subject to a terminal disclaimer.

[21] Appl. No.: 09/128,197

[22] Filed: Aug. 3, 1998

Related U.S. Application Data

[63] Continuation of application No. 08/649,224, May 17, 1996, Pat. No. 5,788,304.

[51] Int. Cl.⁷ ................................................ B65D 85/86
[52] U.S. Cl. .................... 294/159; 118/500; 118/728; 206/710; 211/41
[58] Field of Search ........................... 294/15, 16, 27.1, 294/33, 159, 902; 118/500, 503, 728; 211/41; 206/710–712, 445, 454; 414/935, 937, 938, 940

[56] References Cited

U.S. PATENT DOCUMENTS

| | | | |
|---|---|---|---|
| 4,736,508 | 4/1988 | Poli et al. | 294/64.1 |
| 4,904,515 | 2/1990 | Matsuo et al. | 118/500 |
| 5,336,325 | 8/1994 | Devilbiss et al. | 414/217 |
| 5,364,144 | 11/1994 | Satterfield et al. | 294/27.1 |
| 5,429,251 | 7/1995 | Matthews | 211/41 |
| 5,443,649 | 8/1995 | Sibley | 118/728 |
| 5,468,112 | 11/1995 | Ishii et al. | 414/416 |
| 5,494,524 | 2/1996 | Inaba et al. | 118/500 |
| 5,538,230 | 7/1996 | Sibley | 211/41 |
| 5,562,774 | 10/1996 | Breidenbach et al. | 206/454 |

*Primary Examiner*—Dean J. Kramer
*Attorney, Agent, or Firm*—Kirkpatrick & Lockhart LLP

[57] ABSTRACT

A method of making a wafer carrier for use in the transportation and storage of semiconductor wafers includes providing a unitary frame, forming a corrosion resistant coating, such as a fluoropolymer, covering the frame and providing wafer support elements mounted on the frame. A wafer carrier made by the present method may include a unitary frame having several wafer supports joined by connecting members. The frame is coated with a material, such as a fluoropolymer, which is resistant to corrosive materials typically used in semiconductor fabrication processes.

8 Claims, 3 Drawing Sheets

METHOD OF MAKING A CARRIER FOR AT LEAST ONE WAFER

This is a continuation application of U.S. patent application Ser. No. 08/649,224 filed on May 17, 1996, now U.S. Pat. No. 5,788,304.

BACKGROUND OF THE INVENTION

1. Field of the Invention

The present invention is directed generally to a wafer carrier for use in transportation and storage of semiconductor wafers, and, more particularly, to a wafer carrier having both a rigid structure and resistance to corrosive environments.

2. Description of the Background

Wafer carriers, also known as "wafer boats", are well known in the art of semiconductor fabrication. Wafer carriers are used to store and transport semiconductor wafers during semiconductor fabrication. Wafer carriers are usually transported by robots, although they may also be transported manually. Wafer carriers are often subjected to high temperature environments, such as during diffusion and annealing steps. In addition, wafer carriers are exposed to corrosive environments, such as chemical baths used for etching and cleaning the wafers. Those chemical baths may include chemicals such as hydrofluoric acid, sulfuric acid, phosphoric acid, ammonium hydroxide, hydrochloric acid, hydrogen peroxide, isopropyl alcohol, and nitric acid. Throughout the high temperature and corrosive environments, a wafer carrier must remain structurally sound and chemically stable so as not to damage or contaminate the wafers which it is carrying.

It is known to make wafer carriers from rigid materials such as silicon carbide (SiC) and quartz, as disclosed in U.S. Pat. No. 5,443,649, issued to Sibley, and U.S. Pat. No. 5,468,112, issued to Ishii et al.

Although quartz is the most commonly used material for wafer carriers, it has many deficiencies, such as being hydrophilic, making it difficult to dry after a "water rinse" step, and potentially leaving water marks on the wafers. In addition, quartz is susceptible to etching by commonly used chemicals in the fabrication process.

SiC retains its structural rigidity at high temperatures, so it can be used in high temperature process steps. SiC wafer carriers, however, have several serious deficiencies. For example, like quartz, SiC is hydrophilic and may result in water spots on the wafers. In addition, SiC wafer carriers are typically cast to the desired form, which results in porous SiC. Unfortunately, porous SiC is unsuitable for use as a wafer carrier because it tends to collect contaminants and then disperse them, thereby contaminating the wafers. In addition, porous SiC will also trap water which, upon heating of the wafer carrier, may expand rapidly and damage the wafer carrier. As a result, the porous SiC carrier must be completely coated with a layer of non-porous SiC. All SiC is brittle and a coating of non-porous SiC will frequently crack or chip, exposing the porous SiC within. As an alternative, U.S. Pat. No. 5,443,649 discloses a method to create a wafer carrier composed entirely of non-porous SiC, thereby eliminating the risks associated with using porous SiC. That method, however, requires a complex and expensive process of creating and subsequently removing or destroying an underlying structure on which the non-porous SiC can be deposited by chemical vapor deposition (CVD). If that underlying structure is allowed to remain in the wafer carrier, it may contaminate wafers in the same manner as porous SiC.

SiC in general, including non-porous SiC, is inherently unsuitable for use as a wafer carrier. SiC is brittle, and when wafers are placed in a SiC wafer carrier the wafers rub against the brittle SiC wafer carrier, generating particulates which can contaminate the wafers within the wafer carrier.

An alternative to SiC wafer carriers are wafer carriers constructed from resin mold products, such as tetrafluoroethylene/perfluoroalkyl-vinylether copolymer (PFA) and polypropylene (PP). Those materials are resistant to the chemicals commonly used to clean and etch wafers. Unfortunately, wafer carriers made from those materials are flexible, and they tend to bend and sag after relatively short periods of use. Some wafer carriers currently hold one hundred or more wafers, and resin mold products are unsuitable for use in those large wafer carriers because resin mold products will flex and bend under their own weight. Furthermore, resin mold products become even softer and more flexible in high temperature process steps commonly used in the fabrication of semiconductors.

U.S. Pat. No. 5,468,112, issued to Ishii et al., (the "Ishii Patent") discloses a wafer carrier constructed of resin mold products such as PFA and PP, as well as a wafer carrier constructed of SiC. The Ishii Patent, however, does not disclose a resin mold product and SiC used together to form a wafer carrier. In fact, the Ishii Patent does not even address the problems of structural and chemical instability in a wafer carrier. The Ishii Patent focuses on designing a wafer carrier which supports the wafers in a level manner, and prevents the wafers from being tilted within the wafer carrier. The Ishii Patent also teaches a wafer processing system which is not dependant on the use of the wafer carrier disclosed in the Ishii Patent.

U.S. Pat. No. 5,443,649, issued to Sibley, (the "Sibley Patent") discloses a wafer carrier made from SiC, but does not disclose a wafer carrier made from both SiC and a resin mold product. The Sibley Patent focuses on providing a method for creating a wafer carrier constructed entirely from non-porous SiC formed by CVD. That method requires the use of a support structure, constructed of graphite, on which the SiC, can be deposited. Following the deposition of SiC the support structure must be removed so that it does not contaminate the wafers during processing steps. Although the Sibley Patent recognizes the deficiencies of quartz and porous SiC, it neither recognizes nor provides a solution for the general problems suffered by wafer carriers constructed from non-porous SiC. Instead, the Sibley Patent provides an improved carrier which is superior to the porous SiC carriers previously used, but one which is still subject to deficiencies of SiC.

It is known to construct a wafer carrier from several SiC rods within a PFA shell. The wafer carrier is constructed by first creating a wafer carrier constructed entirely from PFA, boring holes in the wafer carrier where the rods are to be located, and inserting straight rods into the holes within the wafer carrier. Once the rods are inserted in the wafer carrier, the holes may be plugged or filled in a known manner. That structure obviously limits the designer of a wafer carrier to use unconnected, straight rods. Typically, the rods are used to form a "backbone" near the wafer platforms and running the length of the wafer carrier. The rods are not connected, and so there is a gap between them. The PFA coating covers the rods and bridges the gaps between the rods to bind the rods together. The rods provide strength to the wafer carrier, and the PFA coating provides resistance to etching by chemicals commonly used in the semiconductor fabrication process. Those wafer carriers, however, still suffer from the inherent weakness of the PFA material. Although the SiC rods remain rigid, the wafer carrier tends to sag and bend at the gaps between the rods. The bending and sagging causes stress on the PFA structure, which weakens the PFA causing even more bending and sagging. As a result, the wafer carriers have a limited useful life before their lack of rigidity makes them unusable. Such wafer carriers have been known to exhibit failure rates of 50% in a one month period. The weakness of the PFA, and the resultant bending and sagging, also limits the size of wafer carrier which can be constructed. Furthermore, excessive bending and sagging will eventually cause the PFA to split, exposing the rods within the wafer carrier, leading to contamination of the chemical baths and the wafers carried within the wafer carrier.

Thus, the need exists to provide a wafer carrier which is both resistant to chemicals which are commonly used to clean and etch wafers, and structurally sound so that it is rigid enough to support the wafers and maintain the structural integrity of the wafer carrier.

SUMMARY OF THE INVENTION

The present invention is directed generally to a wafer carrier for use in the transportation and storage of semiconductor wafers. More particularly, the invention is a wafer carrier having both a rigid structure and a corrosion resistant coating. The wafer carrier includes a unitary frame having several wafer supports joined by connecting members. The frame is made from a corrosion resistant material such as hastalloy, inkalloy, carbon, quartz, or SiC. The frame is coated with a material, such as a fluoropolymer, which is resistant to corrosive materials typically used in semiconductor fabrication processes.

The invention solves the above-mentioned shortcomings in the prior art by providing a wafer carrier which is rigid enough for use in high temperature process steps, and which is also resistant to corrosive materials typically used in fabricating semiconductor wafers.

BRIEF DESCRIPTION OF THE DRAWINGS

For the present invention to be clearly understood and readily practiced, the present invention will be described in conjunction with the following figures, wherein.

DESCRIPTION OF THE PREFERRED EMBODIMENTS

It is to be understood that the figures have been simplified to illustrate only those aspects of the wafer carrier relevant for a clear understanding of the present invention, while eliminating, for the purpose of clarity, some other elements found in a typical wafer carrier. Those of ordinary skill in the art will recognize that other elements may be desired in a wafer carrier. However, because such elements are well known in the art, and because they do not further aid in the understanding of the present invention, a discussion of such elements is not provided herein.

Figure 1:
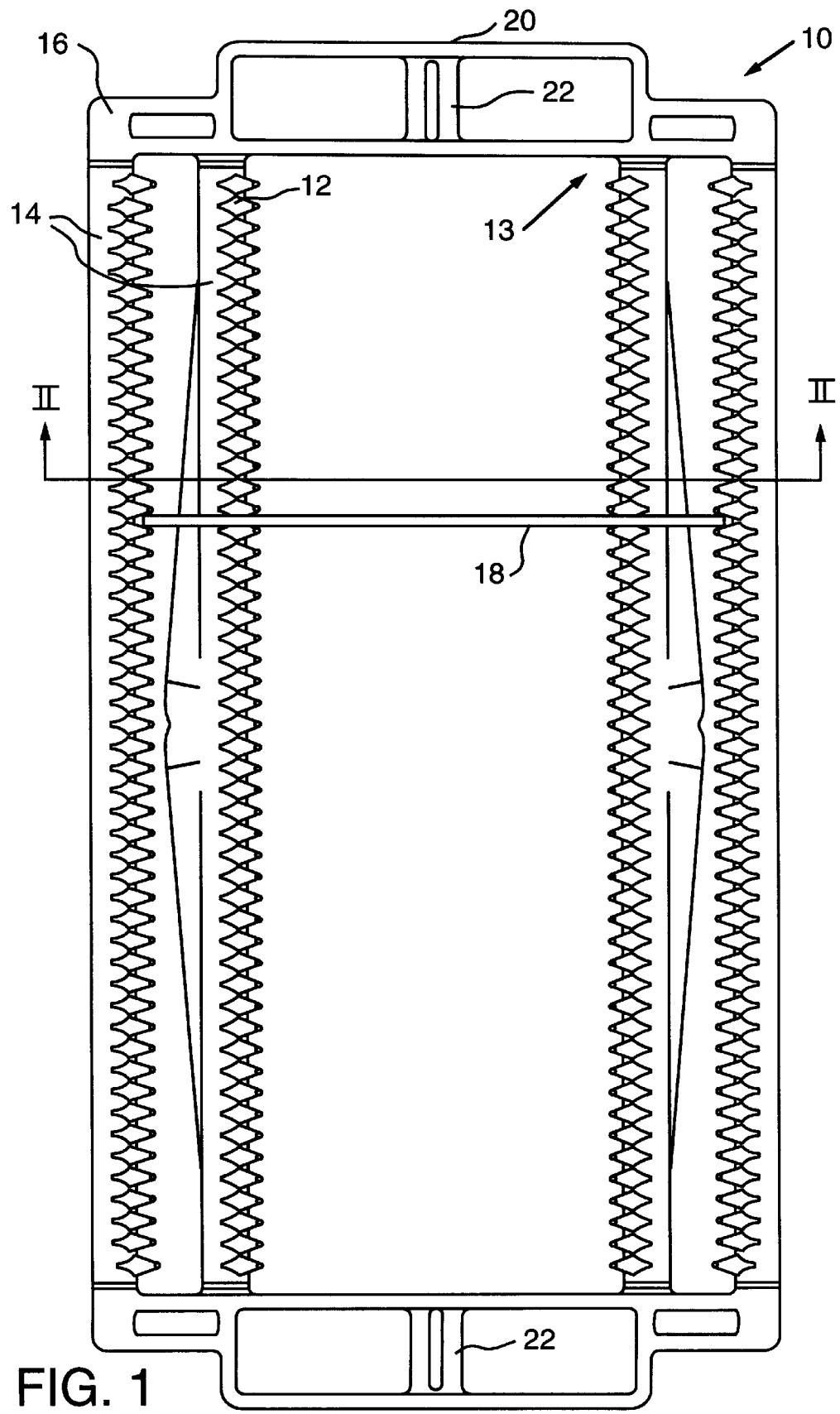
FIG. 1 is a top plan view of a wafer carrier constructed in accordance with the present invention.

FIG. 1 is a top plan view of a carrier 10 constructed in accordance with the present invention for supporting substantially planar objects, such as semiconductor wafers. The wafer carrier 10 includes wafer support elements 12 attached to a unitary frame 13. In a preferred embodiment of the present invention, the frame 13 is constructed of four substantially parallel connecting members 14 which terminate at endplates 16. The wafer support elements 12 are attached to the connecting members 14, and they hold and separate planar objects, such as semiconductor wafers 18 within the wafer carrier 10. The frame 13, including the connecting members 14 and the endplates 16, is coated with a corrosive-resistant coating 20 to protect it from corrosive materials typically used in semiconductor processing steps. In addition, each endplate 16 preferably includes handles 22 which are engaged by a wafer robot (not shown) for transporting and storing the wafer carrier 10, as is well known in the art. Alternatively, the handles 22 may be used to manually move the wafer carrier, as is well known in the art.

The frame 13, including all connecting members 14 and the endplates 16, is a unitary piece. Preferably, the frame 13 is formed by casting or molding the wafer support elements 12, connecting members 14, and endplates 16 into a single piece. Other methods of forming a unitary frame 13 may also be used, such as forming the connecting members 14, endplates 16, and wafer support elements 12 separately and welding or bolting them together. In the preferred embodiment the connecting members 14 are approximately 0.375 inches in diameter and the wafer support elements 12 are spaced approximately 0.25 inches apart.

The frame 13 of the wafer carrier 10 is preferably constructed of a corrosion resistant metal, such as hastalloy and inkalloy. The wafer carrier 10 may also be constructed of other corrosion resistant materials, such as quartz, carbon, and silicon carbide, which remain rigid at high temperatures.

The frame 13, including the connecting members 14 and the endplates 16, are coated with a corrosive-resistant material. Preferably, the coating 20 is a fluoropolymer, such as PFA, PP, and materials sold under the marks HALAR™ and ARMORLYNN™ (ARMORLYNN™ is a trademark of LYNN Industrial Coating Inc., located at 506 East 45th Street, Boise, Id., 83714). Fluoropolymers are preferred as the coating 20 because they are not subject to cracking and flaking as is non-porous SiC. In addition, fluoropolymers tend to be hydrophobic, so that they are easily dried after water rinse steps. The coating 20 may be applied by spraying a liquid form of the coating 20 material onto the frame 13, and allowing the coating material to solidify. Alternatively, the frame 13 may be dipped into a liquid form of the coating 20 material. The coating process can be performed by LYNN Industrial Coating Inc. Preferably, the coating 20 is between approximately three mils and fifteen mils thick, although other coating 20 thicknesses may be used to suit the particular application of the wafer carrier.

Figure 2:
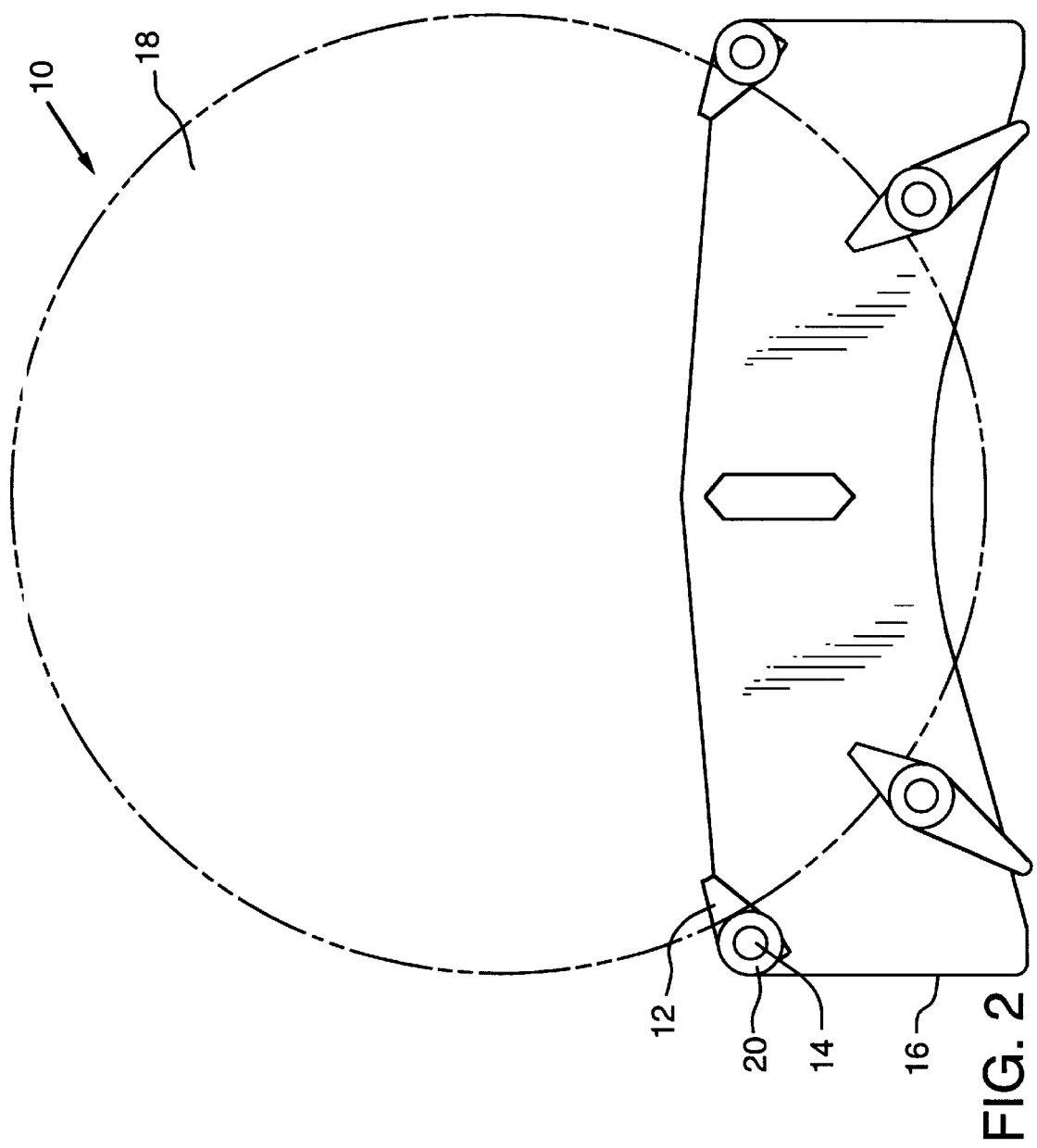
FIG. 2 is a cross-sectional view along line II—II of the wafer carrier illustrated in FIG. 1.

FIG. 2 is a cross-sectional view along line II—II of the wafer carrier 10 illustrated in FIG. 1. The wafer support elements 12 protrude from the connecting members 14, and support the wafer 18 in a generally vertical position. The wafer 18 rests on the connecting members 14 at the bottom of the wafer carrier 10. The wafer 18 is inserted into and removed from the wafer carrier 10 between the connecting members 14 at the top of the wafer carrier 10.

Figure 3:
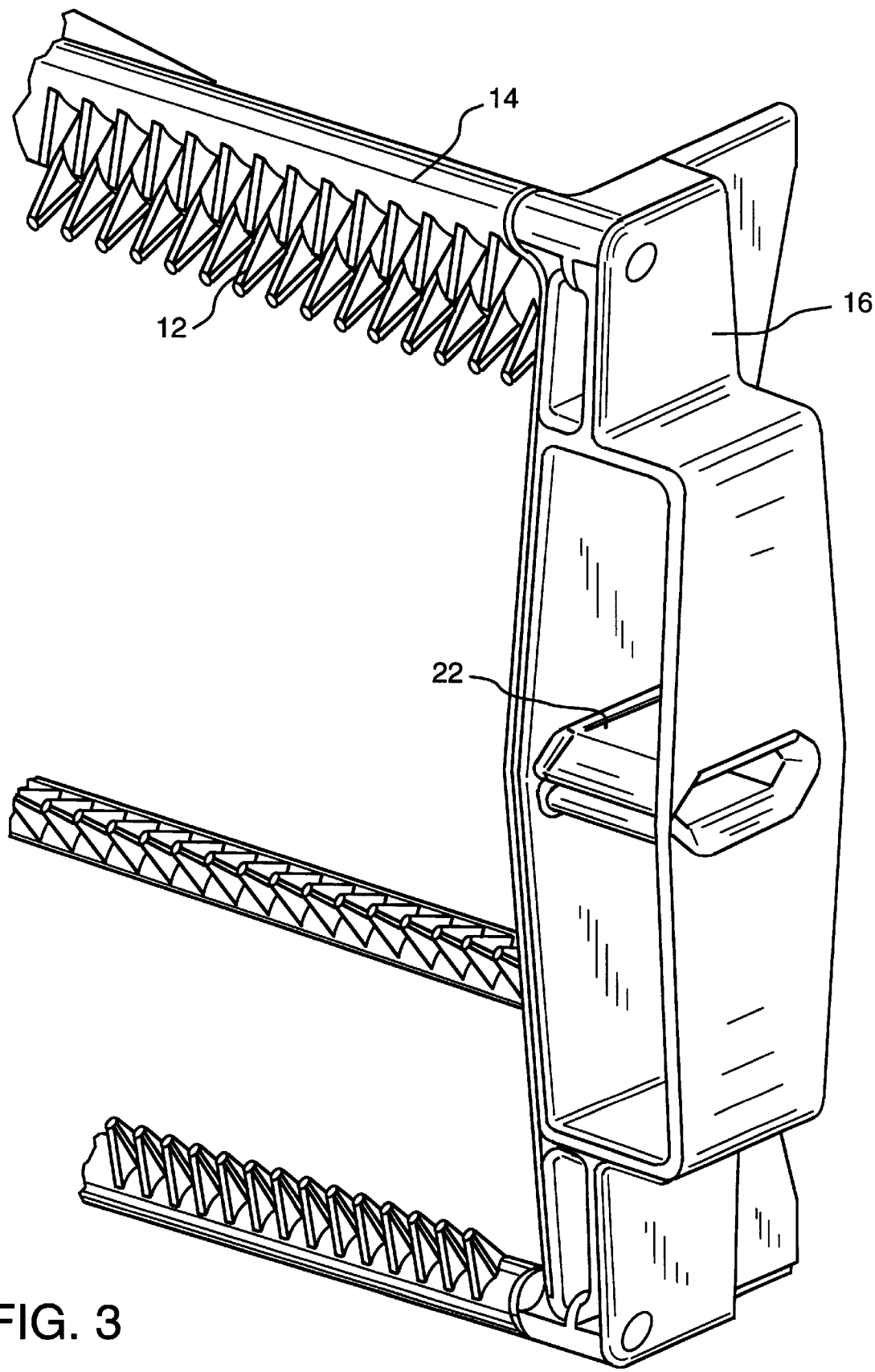
FIG. 3 is a perspective view of one end of the wafer carrier.

FIG. 3 is a perspective view of one end of the wafer carrier 10, showing the wafer support elements 12, the connecting members 14, one endplate 16, and one robot handle 22.

The wafer support elements 12 illustrated in FIGS. 1–3 are small enough that, although they may be formed from the rigid material used for the unitary frame 13, they do not need to be. Preferably, the wafer support elements 12 in the embodiment illustrated in FIGS. 1–3 are formed entirely from the coating 20 material, which is sufficiently rigid to support the weight of a wafer 18. The frame 13, however, including the connecting members 14 and the endplates 16, is a unitary piece in order to maintain a rigid structure in high temperature environments.

The wafer carrier 10 illustrated in FIGS. 1–3 is intended to have its longitudinal axis lie in a horizontal plane, with the wafers 18 oriented vertically. Other types of wafer carriers 10, of course, may utilize the present invention. For example, the invention is readily applied to wafer carriers 10 intended to be oriented vertically and to carry wafers 18 horizontally, as is well known in the prior art. In addition, other connecting members 14 and wafer supports elements 12, as are well known in the prior art, may be used with the unitary frame 13 and coating of the present invention. For example, the frame 13 may include only a single connecting member which connects a plurality of wafer supports and eliminates the need for endplates.

Those with ordinary skill in the art will recognize that many modifications and variations of the present invention may be made. The foregoing description and the following claims are intended to cover all such modifications and variations.

What is claimed is:

1. A method of making a carrier for at least one wafer, the method comprising:
    covering a unitary frame member with a corrosion resistant fluoropolymer coating; and
    mounting wafer support elements formed entirely from material comprising the corrosion resistant fluoropolymer coating on the frame member.

2. The method of claim 1, wherein said frame comprises a corrosion resistant material.

3. The method of claim 2, wherein said corrosion resistant material is constructed from hastalloy or inkalloy.

4. The method of claim 1, wherein said frame is constructed from quartz, graphite, or silicon carbide.

5. The method of claim 4, wherein said fluoropolymer is PFA, PP, HALAR™, or ARMORLYNN™.

6. A method of making a semiconductor wafer carrier for use in holding at least one semiconductor wafer during processing, comprising the steps of:
    providing a unitary frame;
    forming a corrosion resistant fluoropolymer coating covering said frame; and
    providing wafer support elements constructed entirely from the material comprising said corrosion resistant fluoropolymer coating mounted on said frame.

7. A method of making a semiconductor wafer carrier for use in holding at least one semiconductor wafer during processing, comprising the steps of:
    providing a unitary frame comprising:
        a plurality of spaced elongated wafer support members,
        a first endplate coupling one end of each of said support members, and
        a second endplate coupling other ends of said support members,
    providing a corrosion resistant coating covering said frame, said coating comprising a fluoropolymer; and
    providing corrosion resistant wafer support elements formed entirely from the material comprising said corrosion resistant coating and mounted on said support members.

8. A method of making a semiconductor wafer carrier for use in holding at least one semiconductor wafer during processing, comprising the steps of:
    providing a unitary frame comprising:
        a plurality of spaced elongated wafer support members,
        a first endplate coupling one end of each of said support members, and
        a second endplate coupling other ends of said support members;
    said frame being constructed from hastalloy, inkalloy, quartz, graphite, or silicone carbide;
    providing a corrosion resistant coating covering said frame, wherein said coating is PFA, PP, HALAR™, or ARMORLYNN™; and
    providing corrosion resistant wafer support elements formed entirely from the material comprising said corrosion resistant coating and mounted on said support members.

* * * * *